(12) United States Patent
Ogasawara et al.

(10) Patent No.: US 9,159,549 B2
(45) Date of Patent: Oct. 13, 2015

(54) GLASS COMPOSITION FOR PROTECTING SEMICONDUCTOR JUNCTION, METHOD OF MANUFACTURING SEMICONDUCTOR DEVICE AND SEMICONDUCTOR DEVICE

(75) Inventors: Atsushi Ogasawara, Saitama (JP); Kazuhiko Ito, Saitama (JP); Koji Ito, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 13/582,215

(22) PCT Filed: May 26, 2011

(86) PCT No.: PCT/JP2011/062134
§ 371 (c)(1),
(2), (4) Date: Aug. 31, 2012

(87) PCT Pub. No.: WO2012/160704
PCT Pub. Date: Nov. 29, 2012

(65) Prior Publication Data
US 2013/0075873 A1    Mar. 28, 2013

(51) Int. Cl.
*H01L 21/02* (2006.01)
*H01L 23/29* (2006.01)
*C03C 3/066* (2006.01)
*C03C 3/093* (2006.01)
*C03C 8/04* (2006.01)
(Continued)

(52) U.S. Cl.
CPC ............. *H01L 21/022* (2013.01); *C03C 3/066* (2013.01); *C03C 3/093* (2013.01); *C03C 8/04* (2013.01); *C03C 8/24* (2013.01); *H01L 21/02123* (2013.01); *H01L 21/02172* (2013.01);
(Continued)

(58) Field of Classification Search
CPC . H01L 23/291; H01L 23/3178; H01L 21/473; H01L 21/02123
USPC .................... 257/632; 438/778, 763; 427/567
See application file for complete search history.

(56) References Cited

U.S. PATENT DOCUMENTS 5,298,330 A *  3/1994  Stadnicar et al. .............. 428/432
6,214,699 B1 * 4/2001  Joyner .......................... 438/445
(Continued)

FOREIGN PATENT DOCUMENTS

CN    1771211 A    5/2006
JP    5240071 A    3/1977
(Continued)

OTHER PUBLICATIONS

International Search Report for PCT/JP2011/062134, dated Aug. 16, 2011.

*Primary Examiner* — Julio J Maldonado
*Assistant Examiner* — Moazzam Hossain
(74) *Attorney, Agent, or Firm* — Hauptman Ham, LLP (57) ABSTRACT

Provided is a glass composition for protecting a semiconductor junction which contains at least $SiO_2$, $Al_2O_3$, ZnO, CaO and 3 mol % to 10 mol % of $B_2O_3$, and substantially contains none of Pb, P, As, Sb, Li, Na and K. It is preferable that a content of $SiO_2$ falls within a range of 32 mol % to 48 mol %, a content of $Al_2O_3$ falls within a range of 9 mol % to 13 mol %, a content of ZnO falls within a range of 18 mol % to 28 mol %, a content of CaO falls within a range of 15 mol % to 23 mol %, and a content of $B_2O_3$ falls within a range of 3 mol % to 10 mol %.

10 Claims, 7 Drawing Sheets (51) Int. Cl.
*C03C 8/24* (2006.01)
*H01L 29/861* (2006.01)
*H01L 29/06* (2006.01)
*H01L 23/31* (2006.01)
*H01L 21/762* (2006.01)
*H01L 23/00* (2006.01)

(52) U.S. Cl.
CPC .... *H01L21/02318* (2013.01); *H01L 21/76232* (2013.01); *H01L 23/291* (2013.01); *H01L 23/3178* (2013.01); *H01L 23/564* (2013.01); *H01L 29/0661* (2013.01); *H01L 29/8611* (2013.01); *H01L 29/8613* (2013.01); *H01L 2924/0002* (2013.01)

(56) References Cited

U.S. PATENT DOCUMENTS

| | | | |
|---|---|---|---|
| 7,544,629 | B2 | 6/2009 | Ito et al. |
| 2005/0031837 | A1* | 2/2005 | Cho et al. ............ 428/210 |
| 2007/0154713 | A1* | 7/2007 | Rosenflanz et al. ...... 428/408 |
| 2009/0189257 | A1* | 7/2009 | Seki et al. ............ 257/626 |
| 2010/0129726 | A1 | 5/2010 | Tanida et al. |
| 2011/0028300 | A1* | 2/2011 | Zou et al. ............. 501/78 |
| 2011/0241043 | A1* | 10/2011 | Nakayama ............. 257/98 |

FOREIGN PATENT DOCUMENTS

| | | | |
|---|---|---|---|
| JP | 5393783 | A | 8/1978 |
| JP | 5526656 | A | 2/1980 |
| JP | 56045055 | A | 4/1981 |
| JP | 57202742 | A | 12/1982 |
| JP | 1186629 | A | 7/1989 |
| JP | 2163938 | A | 6/1990 |
| JP | 2004087955 | A | 3/2004 |
| JP | 2006221942 | A | 8/2006 |
| JP | 2009203154 | A | 9/2009 |
| WO | 2009/017173 | A1 | 2/2009 |

* cited by examiner

| items | | example 1 | comparison examples 1 | comparison examples 2 |
|---|---|---|---|---|
| composition ratio (mol ratio) | $SiO_2$ | 40 | 75 | 12 |
| | $Al_2O_3$ | 11 | 5 | 0 |
| | ZnO | 23 | 0 | 58 |
| | CaO | 19 | 0 | 0 |
| | $B_2O_3$ | 7 | 0 | 29 |
| | PbO | 0 | 20 | 0 |
| | balance | 0 | 0 | 1 |
| | total | 100 | 100 | 100 |
| evaluation method | evaluation method 1 (environmental load) | good | bad | good |
| | evaluation method 2 (baking temperature) | good | good | good |
| | evaluation method 3 (resistance to chemicals) | good | good | bad |
| | evaluation method 4 (thermal expansion coefficient) | good | good | good |
| | evaluation method 5 (insulation property) | good | good | good |
| comprehensive evaluation | | good | bad | bad |

GLASS COMPOSITION FOR PROTECTING SEMICONDUCTOR JUNCTION, METHOD OF MANUFACTURING SEMICONDUCTOR DEVICE AND SEMICONDUCTOR DEVICE

RELATED APPLICATIONS

The present application is a National Phase of International Application Number PCT/JP2011/062134, filed May 26, 2011.

TECHNICAL FIELD

The present invention relates to a glass composition for protecting a semiconductor junction, a method of manufacturing a semiconductor device and a semiconductor device.

BACKGROUND ART

There has been known a method of manufacturing a semiconductor device where a glass layer for passivation is formed such that the glass layer covers a pn junction exposure part in a process of manufacturing a mesa semiconductor device (see patent document 1, for example).

FIG. 6(a) to FIG. 6(d) and FIG. 7(a) to FIG. 7(d) are views for explaining such a conventional method of manufacturing a semiconductor device. FIG. 6(a) to FIG. 6(d) and FIG. 7(a) to FIG. 7(d) are views showing respective steps.

The conventional method of manufacturing a semiconductor device includes, as shown in FIG. 6 and FIG. 7, "semiconductor base body forming step", "trench forming step", "glass layer forming step", "photoresist forming step", "oxide film removing step", "roughened surface region forming step", "electrode forming step", and "semiconductor base body cutting step" in this order. Hereinafter, the conventional method of manufacturing a semiconductor device is explained in order of steps.

(a) Semiconductor Base Body Forming Step

Firstly, a $p^+$ type diffusion layer 912 is formed by diffusion of a p type impurity from one surface of an $n^-$ type semiconductor substrate (n type silicon substrate) 910, and an $n^+$ type diffusion layer 914 is formed by diffusion of an n type impurity from the other surface of the $n^-$ type semiconductor substrate 910 thus forming a semiconductor base body in which a pn junction arranged parallel to a main surface of the semiconductor base body is formed. Thereafter, oxide films 916, 918 are formed by thermal oxidation on a surface of the $p^+$ type diffusion layer 912 and a surface of the $n^+$ type diffusion layer 914 respectively (see FIG. 6(a)).

(b) Trench Forming Step

Next, a predetermined opening portion is formed on the oxide film 916 at a predetermined position by a photo etching method. After etching the oxide film, subsequently, the semiconductor base body is etched thus forming a trench 920 having a depth exceeding the pn junction as measured from one surface of the semiconductor base body (see FIG. 6(b)).

(c) Glass Layer Forming Step

Figure 6A:
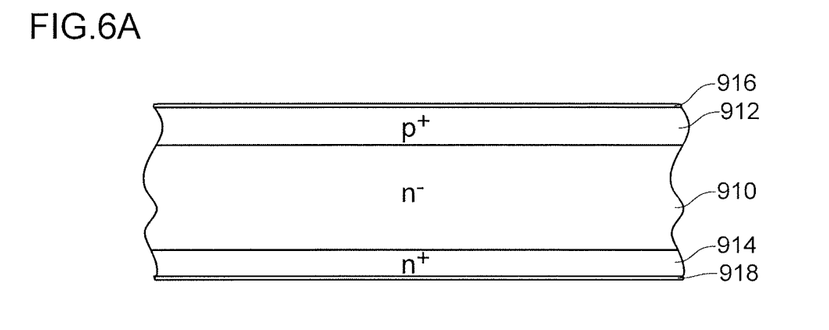
FIG. 6(a) to FIG. 6(d) are views for explaining a method of manufacturing a conventional semiconductor device.
Figure 6B:
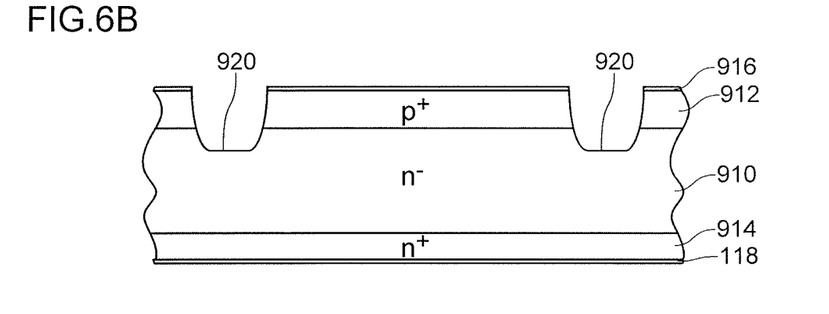
Figure 6C:
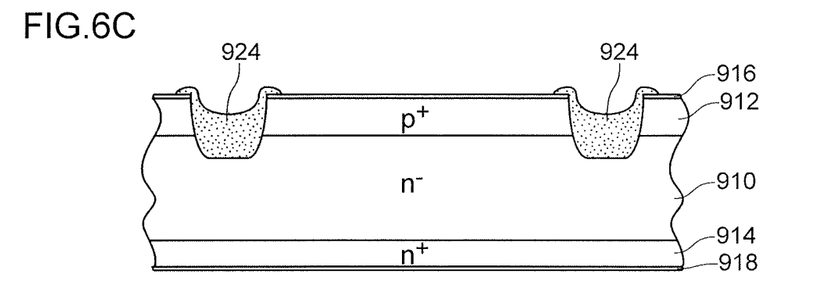

Next, a layer made of the glass composition for protecting a semiconductor junction is formed on an inner surface of the trench 920 and a surface of the semiconductor base body in the vicinity of the trench 920 by an electrophoresis method, and the layer made of the glass composition for protecting a semiconductor junction is baked so that a glass layer 924 for passivation is formed (see FIG. 6(c)).

(d) Photoresist Forming Step

Figure 6D:
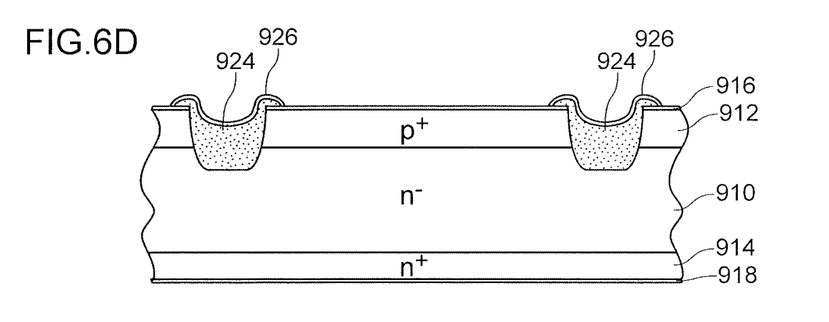

Next, a photoresist 926 is formed such that the photoresist 926 covers a surface of the glass layer 924 (see FIG. 6(d)).

(e) Oxide Film Removing Step

Figure 7A:
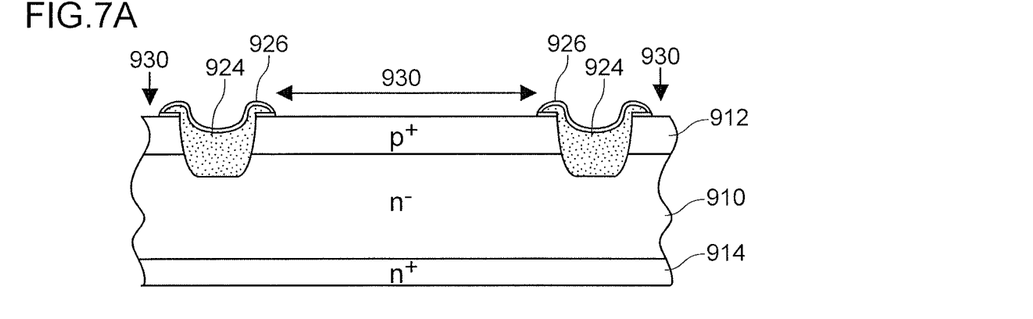
FIG. 7(a) to FIG. 7(d) are views for explaining the method of manufacturing the conventional semiconductor device.

Next, the oxide film 916 is etched using the photoresist 926 as a mask so that the oxide film 916 at a position 930 where a Ni-plating electrode film is to be formed is removed (see FIG. 7(a)).

(f) Roughened Surface Region Forming Step

Figure 7B:
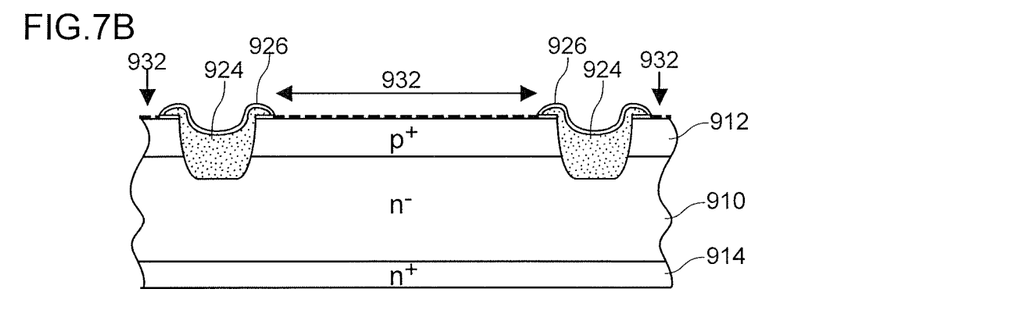

Next, a surface of the semiconductor base body at the position 930 where a Ni-plating electrode film is to be formed is subjected to surface roughening treatment thus forming a roughened surface region 932 for enhancing adhesiveness between a Ni plating electrode and the semiconductor base body (see FIG. 7(b)).

(g) Electrode Forming Step

Figure 7C:
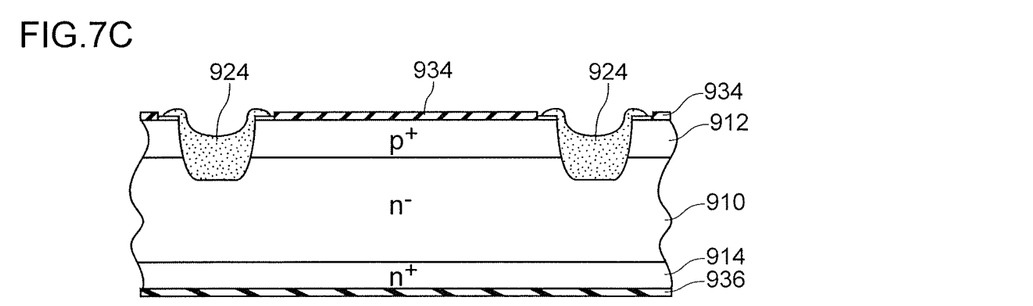

Next, a Ni plating is applied to the semiconductor base body thus forming an anode electrode 934 on the roughened surface region 932 and forming a cathode electrode 936 on the other surface of the semiconductor base body (see FIG. 7(c)).

(h) Semiconductor Base Body Cutting Step

Figure 7D:
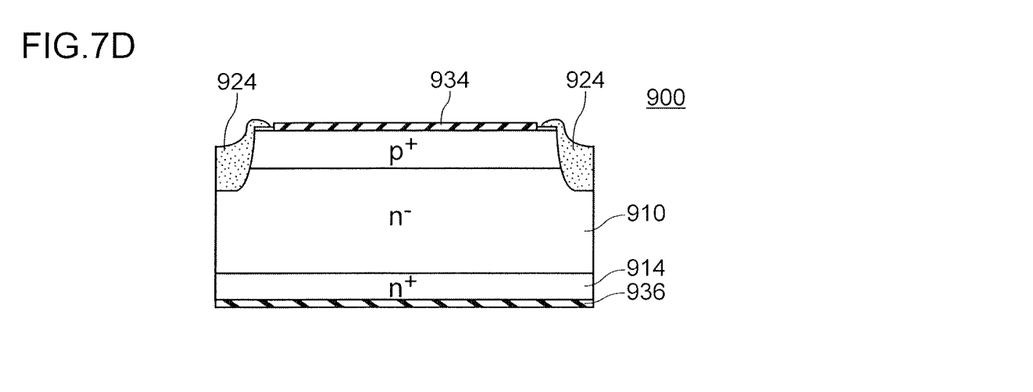

Next, the semiconductor base body is cut by dicing or the like at a center portion of the glass layer 924 thus dividing the semiconductor base body into chips whereby mesa semiconductor devices (pn diodes) are produced (see FIG. 7(d)).

As has been explained heretofore, the conventional method of manufacturing a semiconductor device includes the step of forming the trench 920 exceeding the pn junction as measured from one surface of the semiconductor base body where the pn junction arranged parallel to the main surface is formed (see FIG. 6(a) and FIG. 6(b)), and the step of forming the glass layer 924 for passivation in the inside of the trench 920 such that the glass layer 924 covers the pn junction exposure part (see FIG. 6(c)). Accordingly, in the conventional method of manufacturing a semiconductor device, by cutting the semiconductor base body after forming the glass layer 924 for passivation in the inside of the trench 920, mesa semiconductor devices having a high withstand voltage can be manufactured.

PRIOR ART DOCUMENT

Patent Document

[Patent Document 1] JP-A-2004-87955

SUMMARY OF THE INVENTION

Problems that the Invention is to Solve

A glass material which is used for forming a glass layer for passivation is required to satisfy conditions (a) to (d), that is, the condition (a) that a glass material can be baked at a proper temperature (900° C. or below, for example), the condition (b) that a glass material withstands chemical used in steps, the condition (c) that a glass material has a thermal expansion coefficient close to a thermal expansion coefficient of silicon (particularly, an average thermal expansion coefficient at a temperature of 50° C. to 500° C. being close to an average thermal expansion coefficient of silicon at a temperature of 50° C. to 500° C.), and the condition (d) that a glass material has excellent insulation property. In view of the above, "a glass material containing lead silicate as a main component" has been popularly used.

However, "the glass material containing lead silicate as a main component" contains lead which imposes a large burden on an environment and hence, it is thought that the use of "the glass material containing lead silicate as a main component" is prohibited near future.

The present invention has been made in view of the above-mentioned circumstances, and it is an object of the present invention to provide a glass composition for protecting a semiconductor junction, a method of manufacturing a semiconductor device and a semiconductor device which can manufacture a semiconductor device having high withstand voltage using a glass material containing no lead in the same manner as a conventional case where "a glass material containing lead silicate as a main component" is used.

Means for Solving the Task

[1] A glass composition for protecting a semiconductor junction according to the present invention contains at least $SiO_2$, $Al_2O_3$, ZnO, CaO and 3 mol % to 10 mol % of $B_2O_3$, and substantially contains none of Pb, P, As, Sb, Li, Na and K.

[2] In the glass composition for protecting a semiconductor junction according to the present invention, it is preferable that a content of $SiO_2$ falls within a range of 32 mol % to 48 mol %, a content of $Al_2O_3$ falls within a range of 9 mol % to 13 mol %, a content of ZnO falls within a range of 18 mol % to 28 mol %, a content of CaO falls within a range of 15 mol % to 23 mol %, and a content of $B_2O_3$ falls within a range of 3 mol % to 10 mol %.

[3] A method of manufacturing a semiconductor device according to the present invention is a method of manufacturing a semiconductor device which includes: a first step of preparing a semiconductor element having a pn junction exposure part where a pn junction is exposed; and a second step of forming a glass layer such that the glass layer covers the pn junction exposure part in this order, wherein in the second step, the glass layer is formed using a glass composition for protecting a semiconductor junction which contains at least $SiO_2$, $Al_2O_3$, ZnO, CaO and 3 mol % to 10 mol % of $B_2O_3$, and substantially contains none of Pb, P, As, Sb, Li, Na and K.

[4] In the method of manufacturing a semiconductor device according to the present invention, it is preferable that the first step includes: a step of preparing a semiconductor base body having a pn junction arranged parallel to a main surface of the semiconductor base body; and a step of forming a trench having a depth exceeding the pn junction as measured from one surface of the semiconductor base body thus forming the pn junction exposure part in the inside of the trench, and the second step includes a step of forming the glass layer such that the glass layer covers the pn junction exposure part in the inside of the trench.

[5] In the method of manufacturing a semiconductor device according to the present invention, it is preferable that the second step includes a step of forming the glass layer such that the glass layer directly covers the pn junction exposure part in the inside of the trench. In this case, the formation of the glass layer such that the glass layer "directly" covers the pn junction exposure part means the formation of the glass layer such that the glass layer "directly covers the pn junction exposure part without interposing an insulation layer or the like therebetween".

[6] In the method of manufacturing a semiconductor device according to the present invention, it is preferable that the second step includes a step of forming an insulation film on the pn junction exposure part in the inside of the trench, and a step of forming the glass layer such that the glass layer covers the pn junction exposure part by way of the insulation film.

[7] In the method of manufacturing a semiconductor device according to the present invention, it is preferable that the first step includes a step of forming the pn junction exposure part on a surface of a semiconductor base body, and the second step includes a step of forming the glass layer such that the glass layer covers the pn junction exposure part formed on the surface of the semiconductor base body.

[8] In the method of manufacturing a semiconductor device according to the present invention, it is preferable that the second step includes a step of forming the glass layer such that the glass layer directly covers the pn junction exposure part on a surface of the semiconductor base body. In this case, the formation of the glass layer such that the glass layer "directly" covers the pn junction exposure part means the formation of the glass layer such that the glass layer "directly covers the pn junction exposure part without interposing an insulation layer or the like therebetween".

[9] In the method of manufacturing a semiconductor device according to the present invention, it is preferable that the second step includes a step of forming an insulation film on the pn junction exposure part on the surface of the semiconductor base body, and a step of forming the glass layer such that the glass layer covers the pn junction exposure part by way of the insulation film.

[10] In the method of manufacturing a semiconductor device according to the present invention, it is preferable that the glass composition for protecting a semiconductor junction is set such that a content of $SiO_2$ falls within a range of 32 mol % to 48 mol %, a content of $Al_2O_3$ falls within a range of 9 mol % to 13 mol %, a content of ZnO falls within a range of 18 mol % to 28 mol %, a content of CaO falls within a range of 15 mol % to 23 mol %, and a content of $B_2O_3$ falls within a range of 3 mol % to 10 mol %.

[11] A semiconductor device according to the present invention is a semiconductor device which includes a semiconductor element having a pn junction exposure part where a pn junction is exposed, and a glass layer which is formed such that the glass layer covers the pn junction exposure part, wherein the glass layer is formed using a glass composition for protecting a semiconductor junction which contains at least $SiO_2$, $Al_2O_3$, ZnO, CaO and 3 mol % to 10 mol % of $B_2O_3$, and substantially contains none of Pb, P, As, Sb, Li, Na and K.

[12] In the semiconductor device according to the present invention, it is preferable that a content of $SiO_2$ falls within a range of 32 mol % to 48 mol %, a content of $Al_2O_3$ falls within a range of 9 mol % to 13 mol %, a content of ZnO falls within a range of 18 mol % to 28 mol %, a content of CaO falls within a range of 15 mol % to 23 mol %, and a content of $B_2O_3$ falls within a range of 3 mol % to 10 mol %.

Advantage of the Invention

According to the glass composition for protecting a semiconductor junction, the method of manufacturing a semiconductor device and the semiconductor device of the present invention, as can be clearly understood from embodiments described later, in the same manner as a conventional case where "a glass material containing lead silicate as a main component" is used, a semiconductor device having a high withstand voltage can be manufactured using a glass material which contains no lead.

In the present invention, the content of $B_2O_3$ is set to 3 mol % or more and hence, a baking temperature of the glass composition becomes low (for example, 900° C. or below) compared to a baking temperature of the glass composition which contains no $B_2O_3$ whereby the glass layer can be easily formed. Still further, by setting the content of $B_2O_3$ to 10 mol % or less, there is no possibility that boron is diffused in a semiconductor substrate thus lowering insulation property in a step of baking the glass layer.

In the glass composition for protecting a semiconductor junction according to the present invention, "the composition substantially contains none of Pb, P, As, Sb, Li, Na and K" means that "the composition contains none of Pb, P, As, Sb, Li, Na and K as components" and does not exclude the glass composition where the above-mentioned components are mixed into raw materials of the respective components which constitute glass as impurities. The same goes for the method of manufacturing a semiconductor device and the semiconductor device according to the present invention.

The reason the composition substantially contains no Pb is that the object of the present invention lies in that the semiconductor device having a high withstand voltage can be manufactured by using "a glass material which contains no lead" in the same manner as the conventional case where "a glass material containing lead silicate as a main component" is used.

Further, the reason the composition substantially contains none of P, As and Sb is that although it is advantageous in terms of a baking temperature when the glass composition contains these components, there may be a case where the insulation property is lowered due to the diffusion of these components into the semiconductor base body during baking.

Further, the reason the glass composition substantially contains none of Li, Na and K is that although it is advantageous in terms of an average thermal expansion coefficient and a baking temperature when the glass composition contains these components, there may be a case where insulation property is lowered.

Inventors of the present invention have studied and found out that even when the glass composition substantially contains none of these components (that is, Pb, P, As, Sb, Li, Na, K), provided that the glass composition contains at least $SiO_2$, $Al_2O_3$, ZnO, CaO and 3 mol % to 10 mol % of $B_2O_3$, the glass composition can be used as a glass composition for protecting a semiconductor junction. That is, according to the glass composition for protecting a semiconductor junction of the present invention, as can be clearly understood from the embodiments described later, the semiconductor device having a high withstand voltage can be manufactured by using "a glass material which contains no lead" in the same manner as the conventional case where "a glass material containing lead silicate as a main component" is used.

MODE FOR CARRYING OUT THE INVENTION

Hereinafter, a glass composition for protecting a semiconductor junction, a method of manufacturing a semiconductor device, and a semiconductor device according to the present invention are explained in conjunction with embodiments shown in the drawings.

Embodiment 1

This Embodiment 1 is an embodiment relating to a glass composition for protecting a semiconductor junction.

The glass composition for protecting a semiconductor junction according to Embodiment 1 contains at least $SiO_2$, $Al_2O_3$, ZnO, CaO, and 3 mol % to 10 mol % of $B_2O_3$, and substantially contains none of Pb, P, As, Sb, Li, Na and K.

To be more specific, a content of $SiO_2$ falls within a range of 32 mol % to 48 mol % (for example, 40 mol %), a content of $Al_2O_3$ falls within a range of 9 mol % to 13 mol % (for example, 11 mol %), a content of ZnO falls within a range of 18 mol % to 28 mol % (for example, 23 mol %), a content of CaO falls within a range of 15 mol % to 23 mol % (for example, 19 mol %), and a content of $B_2O_3$ falls within a range of 3 mol % to 10 mol % (for example, 7 mol %).

According to the glass composition for protecting a semiconductor junction of Embodiment 1, as can be understood also from embodiments described later, it is possible to manufacture a semiconductor device having a high withstand voltage using a glass material containing no lead in the same manner as a conventional case where "a glass material containing lead silicate as a main component" is used.

The reason the content of the $SiO_2$ falls within a range of 32 mol % to 48 mol % is that when the content of $SiO_2$ is less than 32 mol %, there may be a case where the chemical resistance is lowered or the insulation property is lowered, while when the content of $SiO_2$ exceeds 48 mol %, there exists a tendency that a baking temperature is elevated.

The reason the content of $Al_2O_3$ falls within a range of 9 mol % to 13 mol % is that when the content of $Al_2O_3$ is less than 9 mol %, there may be a case where the chemical resistance is lowered or the insulation property is lowered, while when the content of $Al_2O_3$ exceeds 48 mol %, there exists a tendency that a baking temperature is elevated.

The reason the content of ZnO falls within a range of 18 mol % to 28 mol % is that when the content of ZnO is less than 18 mol %, there exists a tendency that a baking temperature is elevated, while when the content of ZnO exceeds 28 mol %, there may be a case where the chemical resistance is lowered or the insulation property is lowered.

The reason the content of CaO falls within a range of 15 mol % to 23 mol % is that when the content of CaO is less than 15 mol %, there exists a tendency that a baking temperature is elevated, while when the content of CaO exceeds 23 mol %, there may be a case where the chemical resistance is lowered or the insulation property is lowered.

The reason the content of $B_2O_3$ falls within a range of 3 mol % to 10 mol % is that when the content of $B_2O_3$ is less than 3 mol %, there exists a tendency that a baking temperature is elevated, while when the content of $B_2O_3$ exceeds 10 mol %, there may be a case where the insulation property is lowered.

The glass composition for protecting a semiconductor junction according to Embodiment 1 can be manufactured as follows. That is, raw materials ($SiO_2$, $Al(OH)_3$, ZnO, CaO, $H_3BO_3$) are prepared at the above-mentioned composition ratio (molar ratio), these raw materials are sufficiently mixed by a mixer and, thereafter, the mixed raw material is put into a platinum crucible whose temperature is elevated to a predetermined temperature in an electric furnace and is melted for a predetermined time. Then, the material in a molten state is made to flow out from the crucible and is fed to water-cooled rolls so that glass flakes in a thin flaky shape is obtained. Thereafter, the glass flakes are pulverized to a predetermined average particle size by a ball mill or the like thus obtaining powdery glass composition.

Embodiment 2

Embodiment 2 is an embodiment relating to a method of manufacturing a semiconductor device.

The method of manufacturing a semiconductor device according to Embodiment 2 is a method of manufacturing a semiconductor device which includes: a first step of preparing a semiconductor element which includes a pn junction exposure part where a pn junction is exposed; and a second step of forming a glass layer such that the glass layer covers the pn junction exposure part in this order. In the second step, the glass layer is formed using a glass composition for protecting a semiconductor junction which contains at least $SiO_2$, $Al_2O_3$, ZnO, CaO, and 3 mol % to 10 mol % of $B_2O_3$, and substantially contains none of Pb, P, As, Sb, Li, Na and K (the glass composition for protecting a semiconductor junction according to Embodiment 1). The first step includes a step of preparing a semiconductor base body including a pn junction arranged parallel to a main surface of the semiconductor base body, and a step of forming a trench having a depth exceeding the pn junction as measured from one surface of the semiconductor base body thus forming the pn junction exposure part in the inside of the trench, and the second step includes a step of forming the glass layer such that the glass layer directly covers the pn junction exposure part in the inside of the trench.

FIG. 1(a) to FIG. 1(d) and FIG. 2(a) to FIG. 2(d) are views for explaining a method of manufacturing a semiconductor device according to Embodiment 2. FIG. 1(a) to FIG. 1(d) and FIG. 2(a) to FIG. 2(d) are views showing respective steps.

In the method of manufacturing a semiconductor device according to Embodiment 2, as shown in FIG. 1(a) to FIG. 1(d) and FIG. 2(a) to FIG. 2(d), "semiconductor base body forming step", "trench forming step", "glass layer forming step", "photoresist forming step", "oxide film removing step", "roughened surface region forming step", "electrode forming step", and "semiconductor base body cutting step" are carried out in this order. Hereinafter, the method of manufacturing the semiconductor device according to Embodiment 2 is explained in order of steps.

(a) Semiconductor Base Body Forming Step

Firstly, a $p^+$ type diffusion layer 112 is formed by diffusion of a p type impurity from one surface of an $n^-$ type semiconductor substrate ($n^-$ type silicon substrate) 110, and an $n^+$ type diffusion layer 114 is formed by diffusion of an n type impurity from the other surface of the $n^-$ type semiconductor substrate 110 thus forming a semiconductor base body in which a pn junction arranged parallel to a main surface of the semiconductor base body is formed. Thereafter, oxide films 116, 118 are formed by thermal oxidation on a surface of the $p^+$ type diffusion layer 112 and a surface of the $n^+$ type diffusion layer 114 respectively (see FIG. 1(a)).

(b) Trench Forming Step

Next, a predetermined opening portion is formed on the oxide film 116 at a predetermined position by a photo etching method. After etching the oxide film, subsequently, the semiconductor base body is etched thus forming a trench 120 having a depth exceeding the pn junction as measured from one surface of the semiconductor base body (see FIG. 1(b)).

(c) Glass Layer Forming Step

Figure 1A:
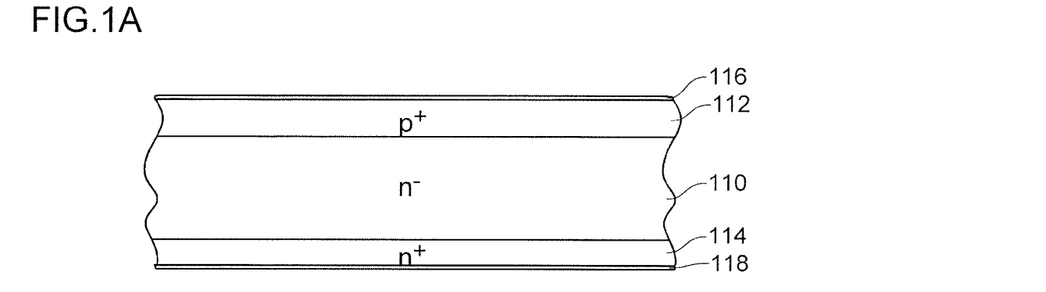
FIG. 1(a) to FIG. 1(d) are views for explaining a method of manufacturing a semiconductor device according to Embodiment 2.
Figure 1B:
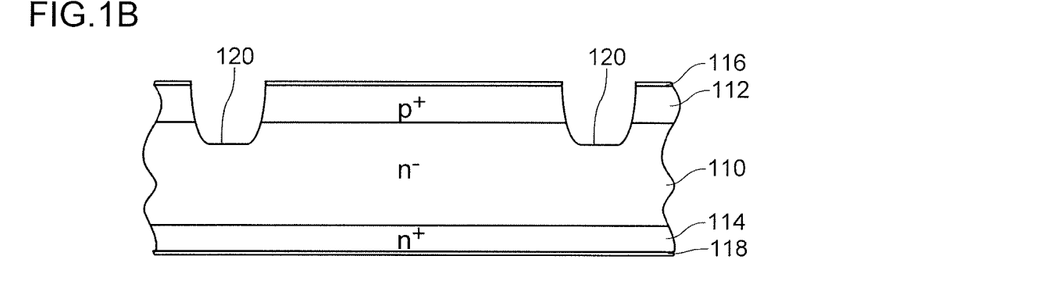
Figure 1C:
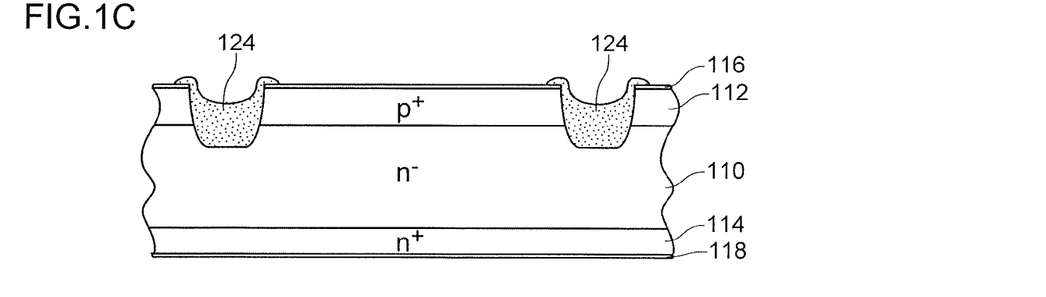

Next, a layer made of the glass composition for protecting a semiconductor junction according to Embodiment 1 is formed on an inner surface of the trench 120 and a surface of the semiconductor base body in the vicinity of the trench 120 by an electrophoresis method, and the layer made of the glass composition for protecting a semiconductor junction is baked so that a glass layer 124 for passivation is formed (see FIG. 1(c)). Accordingly, the pn junction exposure part in the trench 120 is directly covered with the glass layer 124.

(d) Photoresist Forming Step

Figure 1D:
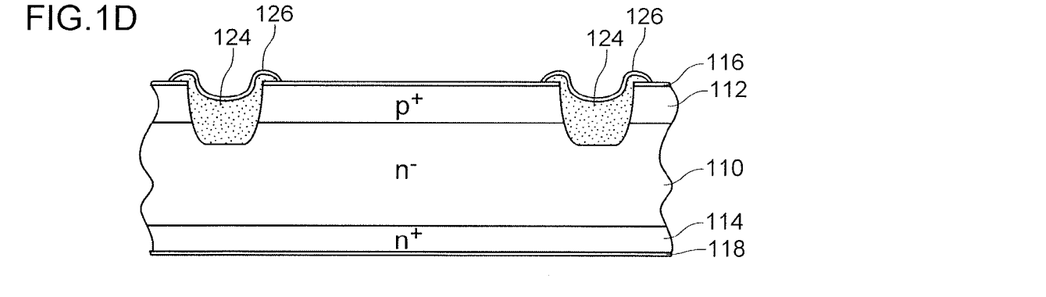

Next, a photoresist 126 is formed such that the photoresist 126 covers a surface of the glass layer 112 (see FIG. 1(d)).

(e) Oxide Film Removing Step

Figure 2A:
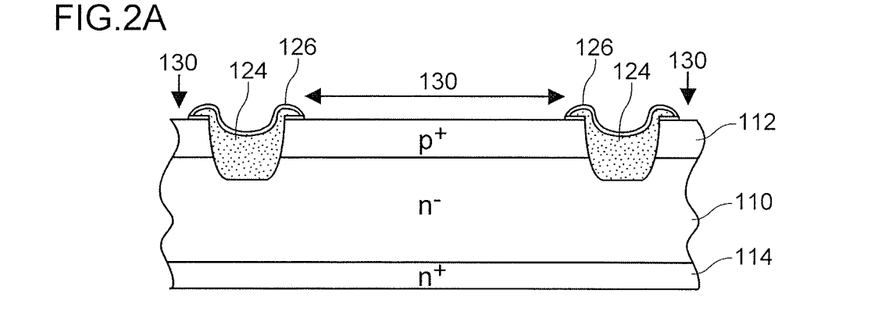
FIG. 2(a) to FIG. 2(d) are views for explaining the method of manufacturing the semiconductor device according to Embodiment 2.

Next, the oxide film 116 is etched using the photoresist 126 as a mask so that the oxide film 116 at a position 130 where a Ni-plating electrode film is to be formed is removed (see FIG. 2(a)).

(f) Roughened Surface Region Forming Step

Figure 2B:
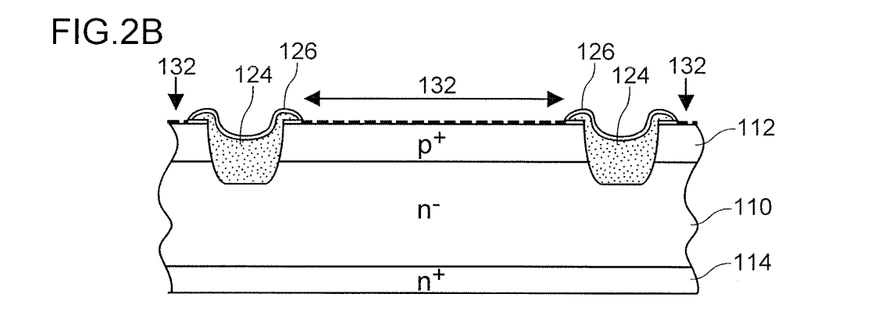

Next, a surface of the semiconductor base body at the position 130 where a Ni-plating electrode film is to be formed is subjected to surface roughening treatment thus forming a roughened surface region 132 for enhancing adhesiveness between a Ni plating electrode and the semiconductor base body (see FIG. 2(b)).

(g) Electrode Forming Step

Figure 2C:
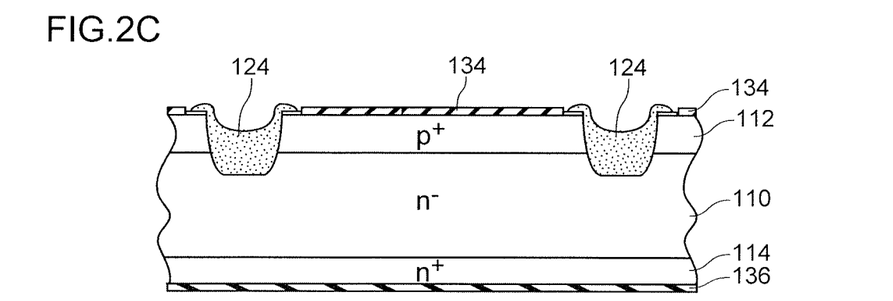

Next, a Ni plating is applied to the semiconductor base body thus forming an anode electrode 134 on the roughened surface region 132 and forming a cathode electrode 136 on the other surface of the semiconductor base body (see FIG. 2(c)).

(h) Semiconductor Base Body Cutting Step

Figure 2D:
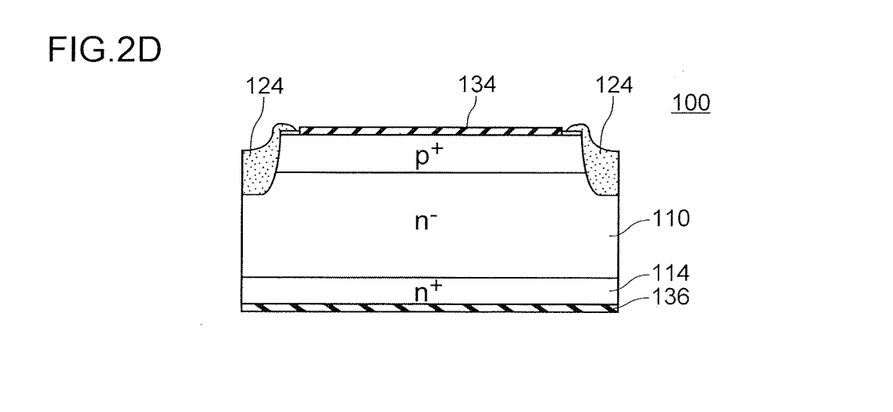

Next, the semiconductor base body is cut by dicing or the like at a center portion of the glass layer 124 thus dividing the semiconductor base body into chips whereby mesa semiconductor devices (pn diodes) are produced (see FIG. 2(d)).

Through the above-mentioned steps, the mesa semiconductor device having a high withstand voltage (semiconductor device according to Embodiment 2) can be manufactured.

Embodiment 3

Embodiment 3 is an embodiment relating to a method of manufacturing a semiconductor device.

The method of manufacturing a semiconductor device according to Embodiment 3 is, in the same manner as the method of manufacturing a semiconductor device according to Embodiment 2, a method of manufacturing a semiconductor device which includes: a first step of preparing a semiconductor element which includes a pn junction exposure part where a pn junction is exposed; and a second step of forming a glass layer such that the glass layer covers the pn junction exposure part in this order. In the second step, the glass layer is formed using a glass composition for protecting a semiconductor junction (the glass composition for protecting a semiconductor junction according to Embodiment 1) which contains at least $SiO_2$, $Al_2O_3$, ZnO, CaO, and 3 mol % to 10 mol % of $B_2O_3$, and contains substantially none of Pb, P, As, Sb, Li, Na and K (the glass composition for protecting a semiconductor junction according to Embodiment 1). However, different from the method of manufacturing a semiconductor device according to Embodiment 2, in the method of manufacturing a semiconductor device according to Embodiment 3, the first step includes a step of forming the pn junction exposure part on a surface of the semiconductor base body, and the second step includes a step of forming the glass layer such that the glass layer directly covers the pn junction exposure part on the surface of the semiconductor base body.

FIG. 3(a) to FIG. 3(c) and FIG. 4(a) to FIG. 4(c) are views for explaining a method of manufacturing a semiconductor device according to Embodiment 3. FIG. 3(a) to FIG. 3(c) and FIG. 4(a) to FIG. 4(c) are views showing respective steps.

In the method of manufacturing the semiconductor device according to Embodiment 3, as shown in FIG. 3(a) to FIG. 3(c) and FIG. 4(a) to FIG. 4(c), "semiconductor base body preparing step", "p$^+$ type diffusion layer forming step", "n$^+$ type diffusion layer forming step", "glass layer forming step", "glass layer etching step" and "electrode forming step" are carried out in this order. Hereinafter, the method of manufacturing a semiconductor device according to Embodiment 3 is explained in order of steps.

(a) Semiconductor Base Body Preparing Step

Figure 3A:
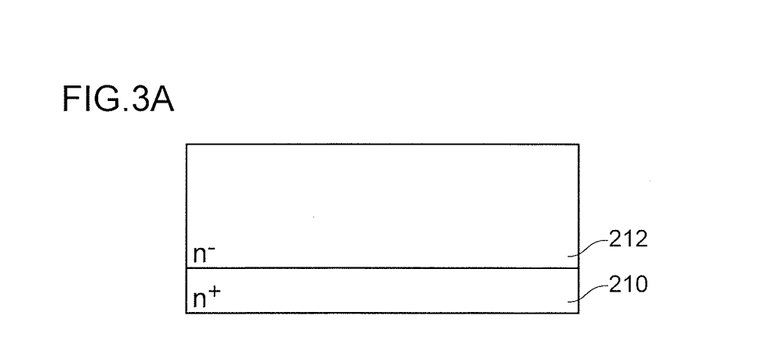
FIG. 3(a) to FIG. 3(c) are views for explaining a method of manufacturing a semiconductor device according to Embodiment 3.
Figure 3B:
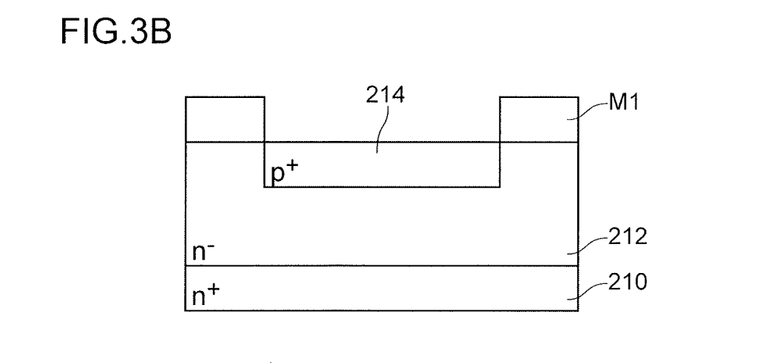
Figure 3C:
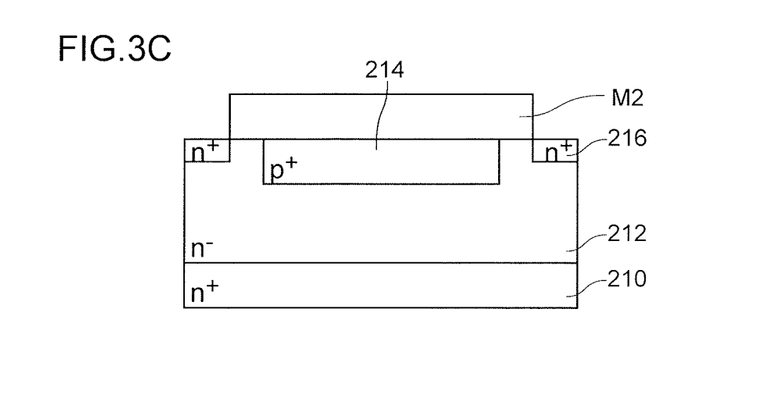

Firstly, a semiconductor base body where an n$^-$ type epitaxial later 212 is laminated on an n$^+$ type silicon substrate 210 is prepared (see FIG. 3(a)).

(b) p$^+$ Type Diffusion Layer Forming Step

Next, after forming a mask M1 on the n$^-$ type epitaxial later 212, a p type impurity (boron ion, for example) is implanted to a predetermined region on a surface of the n$^-$ type epitaxial later 212 by an ion implantation method using the mask M1. Then, a p$^+$ type diffusion layer 214 is formed by thermal diffusion (see FIG. 3(b)).

(c) n$^+$ Type Diffusion Layer Forming Step

Next, the mask M1 is removed from the n$^-$ type epitaxial later 212 and a mask 2 is formed on the n$^-$ type epitaxial later 212. Thereafter, an n type impurity (arsenic ion, for example) is implanted to a predetermined region on the surface of the n$^-$ type epitaxial later 212 by an ion implantation method using the mask 2. Then, an n$^+$ type diffusion layer 216 is formed by thermal diffusion (see FIG. 3(c)).

(d) Glass Layer Forming Step

Next, the mask M2 is removed from the n$^-$ type epitaxial later 212. Thereafter, a layer made of the glass composition for protecting a semiconductor junction according to Embodiment 1 is formed on the surface of the n$^-$ type epitaxial later 212 by a spin coating method and, thereafter, the layer made of the glass composition for protecting a semiconductor junction is baked thus forming a glass layer 215 for passivation (see FIG. 4(a)).

(e) Glass Layer Etching Step

Next, a mask M3 is formed on a surface of the glass layer 215 and, thereafter, the glass layer 215 is etched (see FIG. 4b)). Due to such etching, a glass layer 217 is formed on a predetermined region on the surface of the n$^-$ type epitaxial later 212.

(f) Electrode Forming Step

Figure 4A:
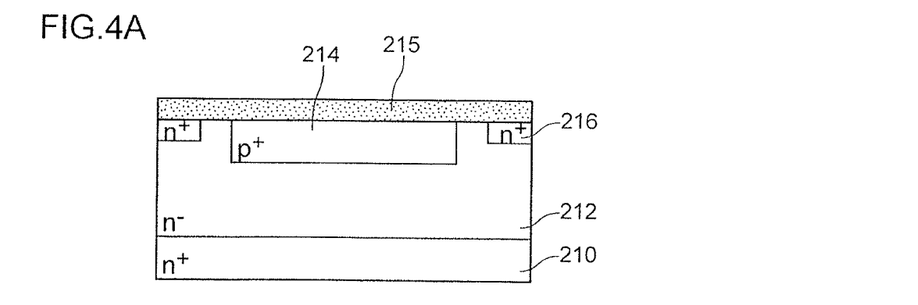
FIG. 4(a) to FIG. 4(c) are views for explaining the method of manufacturing the semiconductor device according to Embodiment 3.
Figure 4B:
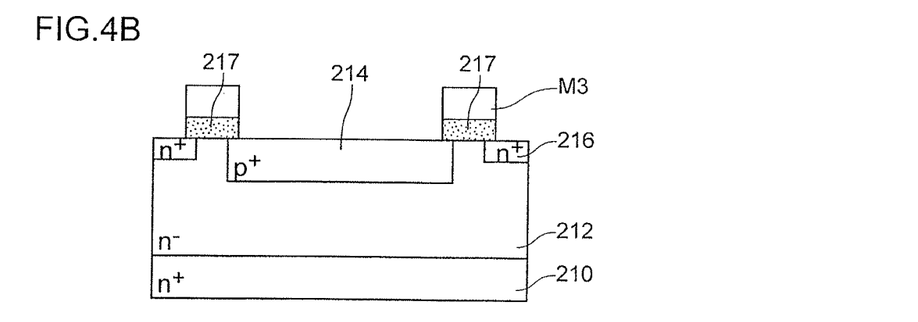
Figure 4C:
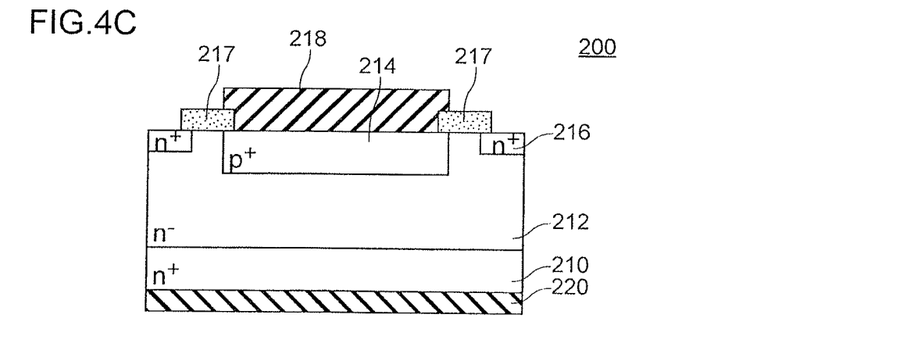

Next, the mask M3 is removed from the surface of the glass layer 215 and, thereafter, an anode electrode 218 is formed on a region of the surface of the semiconductor base body surrounded by the glass layer 216, and a cathode electrode 220 is formed on a back surface of the semiconductor base body (see FIG. 4(c)).

Through the above-mentioned steps, a planer semiconductor device having a high withstand voltage (the semiconductor device according to Embodiment 3) can be manufactured.

EXAMPLES

1. Preparation of Specimens

Figure 5:
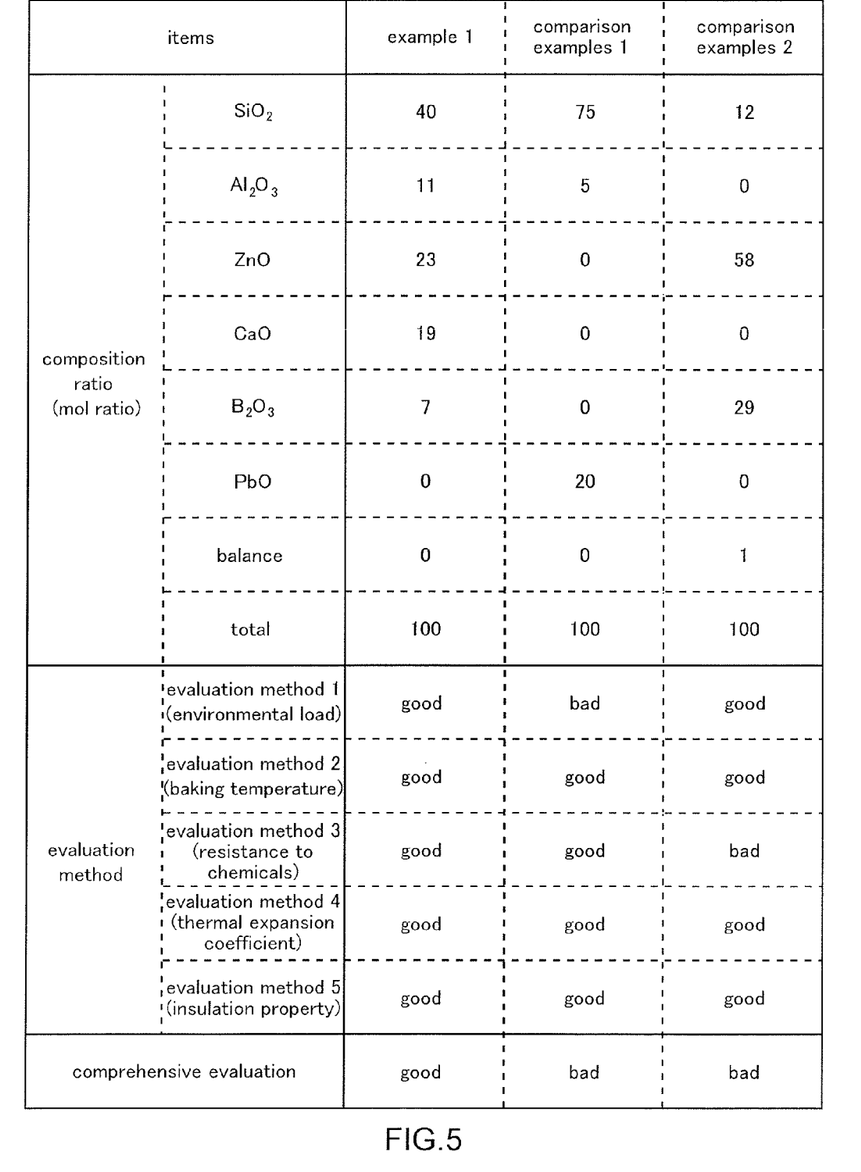
FIG. 5 is a Table showing a result of examples.

FIG. 5 is a Table showing results of examples. In the examples, raw materials are prepared to have composition ratios described in an example 1 and comparison examples 1 and 2, these raw materials are sufficiently mixed by a mixer and, thereafter, the mixed raw material is put into a platinum crucible whose temperature is elevated to a temperature of 1550° C. in an electric furnace and is melted for two hours. Thereafter, the material in a molten state is made to flow out from the crucible and is fed to water-cooled rolls so that glass flakes in a thin flaky shape are obtained. Thereafter, the glass flakes are pulverized to an average particle size of 5 μm by a ball mill thus obtaining powdery glass composition.

The raw materials used in the examples are $SiO_2$, $Al(OH)_3$, ZnO, CaO, $H_3BO_3$ and PbO.

2. The respective glass compositions obtained by the above-mentioned methods are evaluated by the following evaluation methods.

(1) Evaluation Method 1 (Environmental Burden)

The object of the present invention lies in that a semiconductor device having a high withstand voltage can be manufactured by using a glass material which contains no lead in the same manner as the conventional case where "a glass material containing lead silicate as a main component" is used and hence, the evaluation "good" is given when the glass composition contains no lead component, and the evaluation "bad" is given when the glass composition contains a lead component.

(2) Evaluation Method 2 (Baking Temperature)

When the baking temperature is excessively high, the baking temperature largely influences a semiconductor device under manufacture. Accordingly, the evaluation "good" is given when the baking temperature is equal to or below 900° C., the evaluation "fair" is given when the baking temperature falls within a range of 900° C. to 1000° C., and the evaluation "bad" is given when the baking temperature exceeds 1000° C.

(3) Evaluation Method 3 (Chemical Resistance)

The evaluation "good" is given when the glass composition exhibits insolubility to all of aqua regia, a plating solution and a hydrofluoric acid, and the evaluation "bad" is given when the glass composition exhibits insolubility to any one of aqua regia, a plating solution and a hydrofluoric acid.

(4) Evaluation Method 4 (Average Thermal Expansion Coefficient)

The evaluation "good" is given when the difference between an average thermal expansion coefficient of the glass composition and an average thermal expansion coefficient ($3.73 \times 10^{-6}$) of silicon at a temperature of 50° C. to 500° C. is equal to or less than "$0.5 \times 10^{-6}$", the evaluation "fair" is given when the difference falls within a range of "$0.5 \times 10^{-6}$ to $1.0 \times 10^{-6}$", and the evaluation "bad" is given when the difference exceeds "$1.0 \times 10^{-6}$".

(5) Evaluation Method 5 (Insulation Property)

A semiconductor device (pn diode) is manufactured by the same method as the method of manufacturing a semiconductor device according to Embodiment 2, and a backward characteristic of the manufactured semiconductor device is measured. As a result, the evaluation "good" is given when the backward characteristic of the semiconductor device is normal, and the evaluation "bad" is given when the backward characteristic of the semiconductor device is abnormal.

(6) Comprehensive Evaluation

The evaluation "good" is given when the respective evaluations given in accordance with the above-mentioned evaluation methods 1 to 5 are all "good", the evaluation "fair" is given when at least one of the respective evaluations is "fair", and the evaluation "bad" is given when at least one of the respective evaluations is "bad", 3. Result of Evaluation As can be understood from FIG. 5, the evaluation "bad" is given to glass composition of the comparison example 1 with respect to the evaluation item 1. Further, evaluation "bad" is given to the glass composition of the comparison example 2 with respect to the evaluation item 3. To the contrary, the evaluation "good" is given to the glass composition of the example 1 with respect to all evaluation items (evaluation items 1 to 5). As a result, it is found that the glass composition of Embodiment 1 is the glass composition which satisfies all of conditions (a) to (d), that is, the condition (a) that the glass composition can be baked at a proper temperature (900° C. or below, for example), the condition (b) that the glass material withstands chemicals used in steps, the condition (c) that the glass material has a thermal expansion coefficient close to a thermal expansion coefficient of silicon (particularly, an average thermal expansion coefficient at a temperature of 50° C. to 500° C. being close to an average thermal expansion coefficient of silicon at a temperature of 50° C. to 500° C.), and the condition (d) that the glass material has excellent insulation property.

Although the glass composition for protecting a semiconductor junction, the method of manufacturing a semiconductor device and the semiconductor device according to the present invention have been explained heretofore, the present invention is not limited to the above-mentioned embodiments, and various modifications of the present invention can be carried out including the following modifications, for example, without departing from the gist of the present invention.

(1) In the above-mentioned Embodiment 2, in the second step, the glass layer is formed such that the glass layer directly covers the pn junction exposure part in the inside of the trench. However, the present invention is not limited to such a constitution. For example, an insulation film may be formed on the pn junction exposure part in the inside of the trench and, thereafter, a glass layer may be formed such that the glass layer covers the pn junction exposure part by way of the insulation film.

(2) In the above-mentioned Embodiment 3, in the second step, the glass layer is formed such that the glass layer directly covers the pn junction exposure part on the surface of the semiconductor base body. However, the present invention is not limited to such a constitution. For example, an insulation film may be formed on the pn junction exposure part on the surface of the semiconductor base body and, thereafter, the glass layer may be formed such that the glass layer covers the pn junction exposure part by way of the insulation film.

The invention claimed is:

1. A method of manufacturing a semiconductor device comprising:
   a first step of preparing a semiconductor element having a pn junction exposure part where a pn junction is exposed; and
   a second step of forming a glass layer such that the glass layer covers the pn junction exposure part in this order, wherein
   in the second step:
      the glass layer is formed using a glass composition for protecting a semiconductor junction which contains at least $SiO_2$, $Al_2O_3$, ZnO, CaO and 3 mol % to 10 mol % of $B_2O_3$, and contains none of Pb, P, As, Sb, Li, Na and K, and wherein a content of CaO falls within a range of 15 mol % to 23 mol %;
      a layer made of the glass composition for protecting a semiconductor junction is formed on the pn junction exposure part by an electrophoresis method; and
      the layer made of the glass composition for protecting a semiconductor junction is baked so that the glass layer for passivation is formed, and
      the glass composition for protecting a semiconductor junction is baked at 900° C. or below.

2. A method of manufacturing a semiconductor device according to claim 1, wherein
   the first step includes: a step of preparing a semiconductor base body having a pn junction arranged parallel to a main surface of the semiconductor base body; and a step of forming a trench having a depth exceeding the pn junction as measured from one surface of the semiconductor base body and forming the pn junction exposure part in the inside of the trench, and
   the second step includes a step of forming the glass layer such that the glass layer covers the pn junction exposure part in the inside of the trench.

3. A method of manufacturing a semiconductor device according to claim 2, wherein
   the second step includes a step of forming the glass layer such that the glass layer directly covers the pn junction exposure part in the inside of the trench.

4. A method of manufacturing a semiconductor device according to claim 2, wherein
   the second step includes: a step of forming an insulation film on the pn junction exposure part in the inside of the trench; and a step of forming the glass layer such that the glass layer covers the pn junction exposure part by way of the insulation film.

5. A method of manufacturing a semiconductor device according to claim 1, wherein
   the first step includes a step of forming the pn junction exposure part on a surface of a semiconductor base body, and
   the second step includes a step of forming the glass layer such that the glass layer covers the pn junction exposure part on the surface of the semiconductor base body.

6. A method of manufacturing a semiconductor device according to claim 5, wherein
   the second step includes a step of forming the glass layer such that the glass layer directly covers the pn junction exposure part on a surface of the semiconductor base body.

7. A method of manufacturing a semiconductor device according to claim 5, wherein
   the second step includes: a step of forming an insulation film on the pn junction exposure part on the surface of the semiconductor base body, and a step of forming the glass layer such that the glass layer covers the pn junction exposure part by way of the insulation film.

8. A method of manufacturing a semiconductor device according to claim 1, wherein in the glass composition for protecting a semiconductor junction,
   a content of $SiO_2$ falls within a range of 32 mol % to 48 mol %,
   a content of $Al_2O_3$ falls within a range of 9 mol % to 13 mol %, and
   a content of ZnO falls within a range of 18 mol % to 28 mol %.

9. The method of claim 1 wherein the glass composition is made of fine glass particles prepared from a material in a molten state obtained by melting a raw material.

10. The method of claim 8 wherein the glass composition is made of fine glass particles prepared from a material in a molten state obtained by melting a raw material.

* * * * *